United States Patent [19]

Wu et al.

[11] Patent Number: 4,734,829
[45] Date of Patent: Mar. 29, 1988

[54] SHORT ARC LAMP IMAGE TRANSFORMER

[75] Inventors: Frederick Y. Wu, Cos Cob, Conn.; David A. Markle, Saratoga, Calif.

[73] Assignee: The Perkin-Elmer Corporation, Norwalk, Conn.

[21] Appl. No.: 796,339

[22] Filed: Nov. 12, 1985

[51] Int. Cl.⁴ .............................................. F21V 8/00
[52] U.S. Cl. .................... 362/32; 362/307; 362/301; 350/96.10
[58] Field of Search ............. 362/32, 299, 307, 308, 362/300, 301; 350/96.10, 96.15, 96.17, 96.18, 96.20, 525, 524

[56] References Cited

U.S. PATENT DOCUMENTS

| | | | |
|---|---|---|---|
| 3,455,622 | 6/1964 | Cooper | 362/32 |
| 3,772,506 | 11/1973 | Junginger | 350/96.10 |
| 4,389,701 | 6/1983 | Phillips | 362/307 |
| 4,523,257 | 6/1985 | Mori | 362/32 |
| 4,561,043 | 12/1985 | Thompson | 362/806 |

Primary Examiner—William A. Cuchlinski, Jr.
Assistant Examiner—D. M. Cox
Attorney, Agent, or Firm—Thmas P. Murphy; Edwin T. Grimes; Francis L. Masselle

[57] ABSTRACT

A light transformer for converting light from a short arc lamp into an arcuate shape of uniform intensity. Mirror means associated with the short arc lamp projects light from the short arc lamp as a plurality of separate images conforming to the desired arcuate shape onto a plurality of reflecting facets also formed in the desired arcuate shape. Light pipe means formed in the desired arcuate shape is disposed at one end to receive light images via the facets and to emit light at the other end in the desired arcuate shape.

18 Claims, 9 Drawing Figures

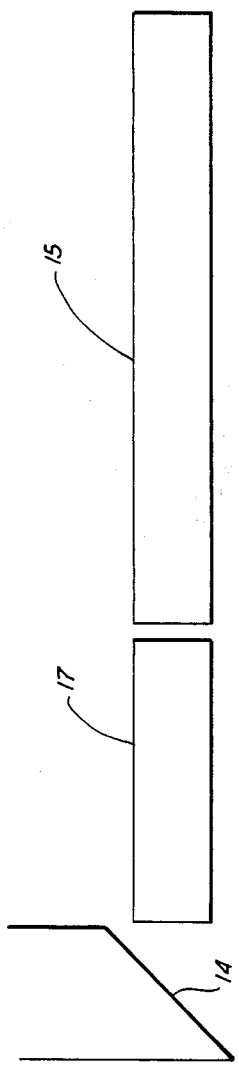
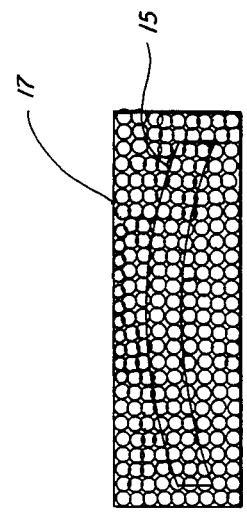
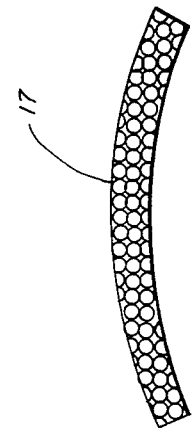

SHORT ARC LAMP IMAGE TRANSFORMER

BACKGROUND OF THE INVENTION

Scanning projection mask aligners of the type described in U.S. Pat. No. 4,068,947 entitled "Optical Projection and Scanning Apparatus" utilized in microlithography incorporate an unique ring field optical system which forms a well corrected image of an object within an off-axis annular field. Such an optical system is described in U.S. Pat. No. 3,748,015 entitled "Unit Power Imaging Catoptric Anastigmat". Effective use of such systems require an illumination system which efficiently illuminates the annular field. One such illumination system which is described in U.S. Pat. No. 4,241,390 entitled "System For Illuminating An Annular Field" utilizes an arcuate shaped source of illumination i.e. an arcuate capillary mercury lamp.

A limiting factor in the use of arcuate capillary lamps is the amount of light available from such lamps relative to a short arc lamp. However, short arc lamps do not inherently have the arcuate shape and uniformity necessary for use in ring field systems. Most techniques for converting light output from a short arc lamp to a desired shape suffer from inefficient use of light, image nonuniformity, complexity and difficulty of fabrication. The present invention overcomes the foregoing mentioned problems.

BRIEF SUMMARY OF THE INVENTION

The present invention relates to a light transformer for converting light from a short arc lamp into an arcuate shape and of uniform intensity. In general the invention utilizes mirror means arranged and constructed to project light from a short arc lamp as a plurality of separate images formed in the desired arcuate shape onto a plurality of reflecting facets also formed in the desired arcuate shape. One end of light pipe means also formed in the desired arcuate shape is disposed to receive the light reflected from the facets and emit light of uniform intensity at its other end.

In one embodiment of the present invention an ellipsoidal mirror projects lights from a short arc lamp located at one of its foci onto a plurality of flat mirrors which project a plurality of images onto respective ones of reflecting facets. The flat mirrors are oriented to reflect the images in the desired arcuate shape onto respective ones of the reflecting facets which are formed in the desired arcuate shape. The reflecting facets are angularly oriented so that the chief rays of all of the reflected images are parallel. A light pipe also formed in the desired arcuate shape has one end disposed to receive the light reflected from the facets and emit light of uniform intensity in the desired arcuate shape at its other end.

A second embodiment of the present invention differs from the first embodiment described above by using an ellipsoidal mirror having a plurality of segments as opposed to a plurality of flat mirrors to project a plurality of images formed into an arcuate shape onto the reflecting facets. In each embodiment the facets are formed on one end of the light pipe and made internally reflecting.

A third embodiment of the present invention differs from the first two embodiments by using externally reflecting facets as a separate element to receive light from a plurality of segments of an ellipsoidal mirror or a plurality of flat mirrors and then reflect the light onto the end of a light pipe via a third mirror. In this embodiment both the faceted mirror and light pipe are in a ring field.

BRIEF DESCRIPTION OF THE DRAWINGS

FIG. 5 is a view of modification adopted to be used in association with the embodiment of FIGS. 3A and 3B; and FIGS. 6A and 6B are variations of the fiber bundle depicted in FIG. 5.

DESCRIPTION OF THE INVENTION

Figure 1:
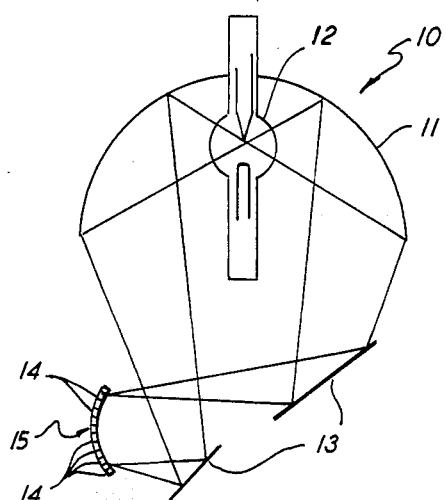
FIG. 1 is an illustration of a first embodiment of the present invention.
Figure 4:
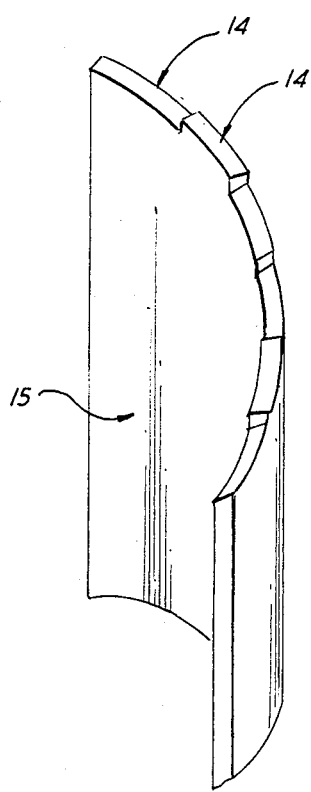
FIG. 4 is a partial pictorial view of a light pipe having facets at one end.

Referring to FIG. 1 there is shown a light transformer 10 of the present invention. It comprises an ellipsoidal mirror 11. Ellipsoidal mirror 11 is in the present invention part, e.g., half of an ellipsoid having an inner reflecting surface. Such a mirror is available as a standard item e.g. purchasable from Optical Radiation Corporation (Azusa, Calif.) An ellipsoidal mirror functions in such a way that a light source placed at its inner focus focuses at its outer focus, the foci being the normal foci of an ellipse. A short arc lamp 12 of a type purchasable from Canrad-Hanovia, Newark, N.J., is placed at the first or inner focus of ellipsoidal mirror 11. Under normal conditions this light would reflect from the ellipsoidal mirror and focus at the second or outer focus. However, since it is desired to form the light into an arcuate shape a plurality (e.g. five or six in a practical embodiment) of mirror flats 13 are disposed to receive the reflected light from ellipsoidal mirror 11 and reflect it onto internally reflecting facets 14 formed at one end of a light pipe 15 of arcuate shape. In FIG. 1 only the faceted end of the light pipe 15 is shown since the length extends into the plane of the Figure. FIG. 4, however, illustrates the form of light pipe 15 with internally reflecting facets 14.

The mirror flats 13 are so disposed and angularly oriented to project light from the lamp 12 as a plurality of separate images forming the desired arcuate shape onto respective ones of a like plurality of facets 14. In a practical embodiment there are six mirror flats 13 and six facets 14, although the number may be more or less depending on the solid angle over which light is to be collected and the degree of complexity that can be tolerated. The faceted end of light pipe 15 is disposed within the focal plane defined by the outer focus of the ellipsoidal mirror 11, at the same length from the inner foci of the ellipsoidal mirror 11 as that of the outer foci. The exact focal points of the image on the separate facets 14 is of course determined by the angular orientation of the mirror flats 13. This achieves the arcuate shape of the projected images to be in conformance with the arcuate shape of light pipe 15 and the facets 14 formed thereon.

The facets 14 are oriented such that each image impending on one facet is caused to be reflected down through the light pipe 15 such that its chief ray is parallel to the chief rays of adjacent images and to the axis of the light pipe. The chief ray is the center ray of each of the image cones projected onto individual facets 14. Thus, the light transmitted through the light pipe 15 emerges at the other end thereof in the desired arcuate shape and of highly uniform intensity capable of efficient use as the illumination source in the ring field projection mask aligner systems of the type disclosed in the patents identified above.

Figure 2A:
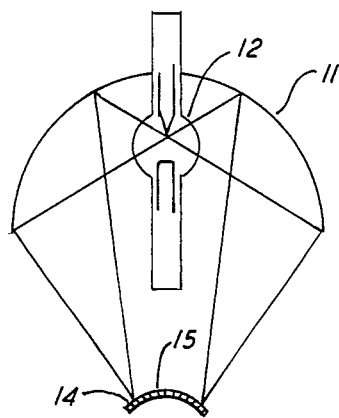
FIGS. 2A and 2B are elevational and bottom views of a second embodiment of the present invention.
Figure 2B:
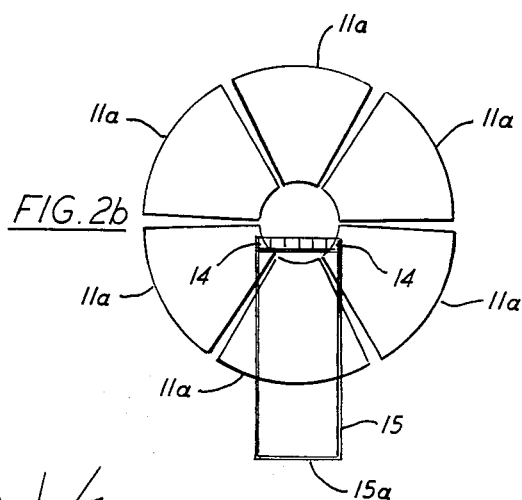

FIGS. 2A and 2B illustrate a second embodiment of the present invention which differs from that of FIG. 1 by forming the ellipsoidal mirror 11 into a plurality of segments 11a which replace the mirror flats 13. In this embodiment the segments 11a are positioned to cause the plurality of reflected images to conform to the desired arcuate shape with each reflected image falling on a respective facet 14 of the similarly arcuate shaped light pipe 15. In this embodiment also the internally reflecting facets are oriented to cause the images to be reflected through the light pipe 15 such that the chief rays of each bundle or cone are parallel to adjacent chief rays. The light emerges from the other end 15a of the light pipe 15 of uniform intensity and in the appropriate arcuate shape.

Figure 3A:
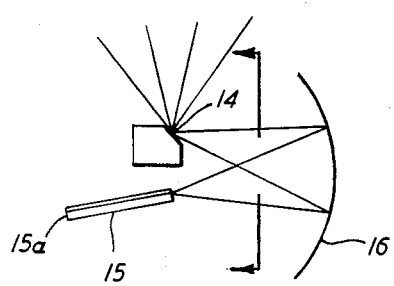
FIG. 3A is a partial elevational view of a third embodiment of the present invention.
Figure 3B:
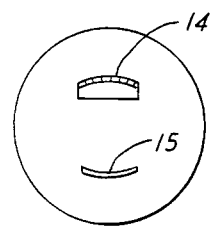
FIG. 3B is a view taken through line 3—3 of FIG. 3A.

The embodiment of FIGS. 3A and 3B may use either the segmented ellipsoidal mirror or mirror flats (neither of which is shown) to project the plurality of light images of arcuate shape onto respective ones of a plurality of facets 14 arranged in the appropriate arcuate shape. In this case, however, the facets 14 are coated to be externally reflecting. Since the facets are not formed on the end of a light pipe, they may be made of individual segments clamped or otherwise secured together. The plurality of images in arcuate form are reflected by spherical mirror 16 onto arcuate light pipe 15 as shown. Here too the facets 14 are oriented to ensure that the chief rays entering the light pipe 15 are parallel. As shown in FIG. 3B the facets 14 and light pipe 15 are in a ring field assuring good imaging by spherical mirror 16.

In the foregoing discussed embodiments, it is necessary that the light pipe has a relatively long length to achieve uniformity for a particular numerical aperture. For example, in a practical embodiment the length of the light pipe 15 was 22 inches.

The facet mirrors may be placed in close proximity to the arcuate light pipe with little loss of performance. The spherical mirror 16 is not necessary in this embodiment.

In practice, it has been found that uniformity can be achieved at shorter light pipe lengths, e.g., 10″ for the same by use of an additional optical element inserted between the facet mirror 14 and the arcuate light pipe 15.

FIG. 5 illustrates this arrangement and shows the mirror facet assembly 14 arcuate light pipe 15, and the optical element in the form of a fiber bundle 17.

The optical element 17 comprises a bundle of straight glass or fused silica fibers of circular cross-section packed as closely together as possible for best efficiency. The shape of the bundle 17 may be arcuate to match the arcuate shape of the light pipe as shown in FIG. 6A or it may have any shape as long as it encompasses the input face of the arcuate light pipe 15, as shown in FIG. 6B.

The light rays that form each image of the arc source lie inside a cone. However, the distribution of rays in the cone is not uniform due to the properties of the ellipsoid. This causes the average or "centroid" ray to be different from the chief ray, which lies on the axis of the cone. The circular fibers improve the uniformity of rays in the cone, and if the fibers are long enough compared to their diameter, the centroid ray will coincide with the chief ray. This provides better spatial uniformity at shorter light pipe lengths. The fibers should have a large ratio of length to diameter, e.g., of at least 50. Consequently, the bundle should be made of small fibers to minimize its length. The lower limit on fiber diameter is determined only by fragility and difficulty of assembly. A reasonable value is 0.5 mm fiber diameter vs 50 mm length.

Coupling between the fiber bundles 17 and the light pipe 15 may be optimized by either placing them in close proximity or by cementing them together.

The foregoing modification of FIG. 5 is of course intended for use with the embodiment of FIGS. 3A and 3B where the facets 14 are externally reflecting.

In all the above embodiments the facets have the purpose of making the light rays associated with each image at the input end of the light pipe span the same range of angles inside the light pipe.

Other modifications of the present invention are possible in light of the above description which should not be construed or placing limitations thereon beyond those set forth in the claims which follow:

What is claimed is:

1. A light transformer, comprising:
   a point source of light;
   mirror means associated with said point source of light for projecting said light as a plurality of separate images conforming as a group to a desired shape;
   a like plurality of reflecting facets formed as a group to said desired shape, each of said facets disposed to receive respective ones of said images and oriented to reflect said images such that the chief ray of each image is parallel to the chief rays of adjacent images;
   light pipe means formed in said desired shape for receiving at one end said images whereby light emitted at the other end of said light pipe means conforms to said desired shape.

2. A light transformer according to claim 1 wherein:
   said facets are externally reflecting.

3. A light transformer according to claim 2 further including:
   spherical mirror means for reflecting said images reflected from said facets onto said one end of said light pipe means.

4. A light transformer according to claim 3 wherein said mirror means comprises:
   an ellipsoidal mirror having said point source of light disposed at the inner focus,
   said ellipsoidal mirror comprising a like plurality of segments oriented to reflect said images as a group in said desired shape onto said facets.

5. A light transformer according to claim 3 wherein said mirror means comprises:
   an ellipsoidal mirror having said point source of light disposed at the inner focus;
   a like plurality of mirror flats disposed and oriented to reflect said images as a group in said desired shape onto said facets.

6. A light transformer according to claim 4 wherein said desired shape is arcuate.

7. A light transformer according to claim 5 wherein said desired shape is arcuate.

8. A light transformer according to claim 1 wherein: said facets are internally reflecting and are formed at said one end of said light pipe means.

9. A light transformer according to claim 8 wherein said mirror means comprises:
an ellipsoidal mirror having said point source of light disposed at the inner focus;
said ellipsoidal mirror comprising a like plurality of segments oriented to reflect said images as a group in said desired shape onto said facets.

10. A light transformer according to claim 8 wherein said mirror means comprises:
an ellipsoidal mirror having said point source of light disposed at the inner focus;
a like plurality of mirror flats disposed and oriented to reflect said images as a group onto said facets.

11. A light transformer according to claim 9 wherein said point source of light is a short arc lamp.

12. A light transformer according to claim 10 wherein said point source of light is a short arc lamp.

13. A light transformer according to claim 11 wherein said desired shape is arcuate.

14. A light transformer according to claim 12 wherein said desired shape is arcuate.

15. A light transformer according to claim 7 further including fiber bundle of circular optical fibers disposed between said facets and said one end of said light pipe means.

16. A light transformer according to claim 15 wherein one end of said fiber bundle is in close proximity to said one end of said light pipe means.

17. A light transformer according to claim 16 wherein one end of said fiber bundle is cemented to said one end of said light pipe means.

18. A light transformer according to claim 17 wherein the shape of said fiber bundle is arcuate to match the shape of said light pipe means.

* * * * *